United States Patent [19]
Takeda et al.

[11] 4,370,522
[45] Jan. 25, 1983

[54] FM RECEIVER FOR USE WITH MOTORCARS

[75] Inventors: Shigeki Takeda; Junichi Shibata; Masashi Shimakata; Yasuhiro Oshime; Shintaro Gomi; Katsuaki Kawamura, all of Kawagoe, Japan

[73] Assignee: Pioneer Electronic Corporation, Tokyo, Japan

[21] Appl. No.: 241,460

[22] Filed: Mar. 3, 1981

[30] Foreign Application Priority Data

Mar. 3, 1980 [JP] Japan .................. 55-26274
Mar. 3, 1980 [JP] Japan .................. 55-27291[U]

[51] Int. Cl.³ .................. H04N 5/00; H01Q 1/00; H01Q 1/32; H01Q 3/00
[52] U.S. Cl. .................. 179/1 GD; 179/1 VE; 343/711; 343/904
[58] Field of Search .................. 179/1 VE, 1 GD; 343/711, 793, 803, 805, 893, 904, 712, 713, 709, 906

[56] References Cited

U.S. PATENT DOCUMENTS

| | | | |
|---|---|---|---|
| 2,609,503 | 9/1952 | Middlemark | 343/904 |
| 2,904,674 | 9/1959 | Crawford | 343/711 X |
| 3,004,153 | 10/1961 | Alford | 343/711 X |
| 4,257,048 | 3/1981 | Yokoi et al. | 343/709 |

OTHER PUBLICATIONS

"Automatic Antenna Selector for Receiving TV Broadcasts in Vehicle," Matsushita National Tech. Report, vol. 21, No. 3, pp. 441–451, Jun. 1975.

*Primary Examiner*—R. J. Hickey
*Attorney, Agent, or Firm*—Michael J. Striker

[57] ABSTRACT

An FM receiver provided with an array of antennas and suitable for use in a moving vehicle such as a motorcar, which is provided with means for automatically avoiding multipath noises. The means so operates as to connect one of the antennas in an instantaneously best sensing condition to an FM tuner.

6 Claims, 10 Drawing Figures

FM RECEIVER FOR USE WITH MOTORCARS

FIELD OF THE INVENTION

The present invention relates to an FM receiver and more particularly to an FM receiver suitable for use in a vehicle such as a motorcar, in which the multipath noises can be automatically reduced.

BACKGROUND OF THE INVENTION

In FM wireless communication it is known that the multipath transmission of a frequency-modulated signal radio wave reduces the quality of communication. This problem in FM communication is of significant importance particularly in case the FM receiving unit is mounted in a vehicle such as a motorcar, since all the scattering objects on the earth may cause the multipath transmission of radio waves and a motorcar runs through or between such objects.

In a prior art FM receiver, means for avoiding or reducing the multipath noises is provided which comprises an array of receiving directional antennas having directions of maximum sensitivity different from each other, a control circuit adapted to detect multipath noises in a demodulated FM wave in order to generate a control signal when a multipath noise appears in the wave, and a switching means responsive to the control signal for selectively connecting suitable one of said antennas to a front end circuit of the FM tuner.

In an FM receiver of the above-mentioned type it is a problem that pulse noises of high frequency originated from for example electric discharges of ignition plugs of a motorcar may be caught by the antennas in addition to the multipath noises. Accordingly, pulse noises or high frequency noises as well as multipath noises are included in the demodulated signals in the FM tuner, with the result that said control circuit generates the control signal in response to not only multipath noises but also the noise pulse caused by the ignitions whereby the receiving antennas are needlessly switched one to the other whenever the noise pulses are caught by the antennas.

It is thus the object of the present invention to provide an FM receiver with receiving directional antennas in which the above-mentioned drawback is eliminated and the noise due to the multipath noises can be effectively suppressed without undue operation caused by pulse noises other than the multipath noises.

SUMMARY OF THE INVENTION

In order to accomplish the above object, the present invention contemplates an FM receiver comprising at least two receiving directional antennas which have derections of maximum sensitivity different from each other; demodulating circuit adapted to demodulate frequency-modulated signal into a low frequency signal substantially corresponding to the original modulating signal; pulse noise suppressing means connected to said demodulating circuit for suppressing high frequency noise components in said low frequency signal; multipath noise detecting circuit connected to said pulse noise suppressing means for monitoring the output signal of said pulse noise suppressing means and generating alternately one of at least two predetermined control signals when multipath noise components with frequencies lower than said high frequency noise components appear in the output of said pulse noise suppressing means; switching means connected to said multipath noise detecting circuit for selectively connecting, in response to said control signals, one of the antennas to the input of said demodulating circuit; and multiplex decording circuit connected to said pulse noise suppressing means for decording the low frequency signal into the multiplexed original signals.

Preferably, the receiving antennas are provided two in number and the multipath noise detecting circuit comprises a high-pass filter connected to the pulse noise suppressing means, a detecting and wave-shaping circuit connected to the high-pass filter for detecting and wave-shaping the multipath noise from the high-pass filter into a rectangular pulse, and a bistable multivibrator connected to the detecting and wave-shaping circuit for generating the control signal to be fed to the switching means.

BRIEF DESCRIPTION OF THE DRAWING

The features and advantages of an FM receiver according to the present invention will be more clearly understood from the following description taken in conjunction with the accompanying drawings, in which.

DESCRIPTION OF THE PREFERRED EMBODIMENT

Figure 1:
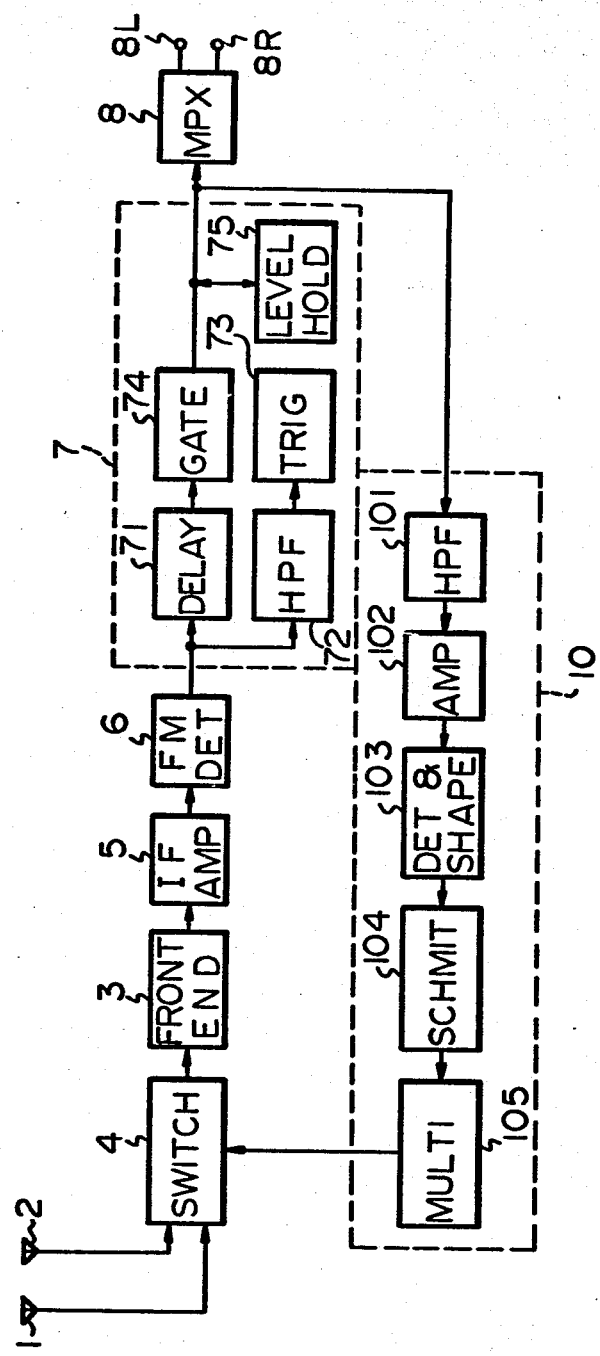
FIG. 1 is a schematic block diagram showing an embodiment of the present invention.
Figure 3A:
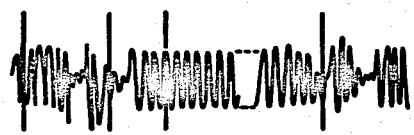
FIGS. 3A and 3B are diagrams showing waveforms received by antennas.
Figure 3B:
Figure 3C:
FIG. 3C is a diagram showing a waveform fed to a front end circuit.
Figure 3D:
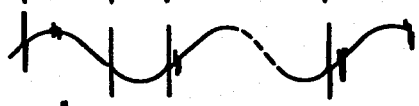
FIG. 3D is a diagram showing a waveform occurring at an output of a demodulating circuit.
Figure 3E:
FIG. 3E is a diagram showing a waveform occurring at an output of a pulse noise suppressing means.

Referring now to drawings, FIG. 1 shows an embodiment of the FM receiver according to the present invention which has preferably two receiving derectional antennas 1 and 2. The two receiving directional antennas 1 and 2 are respectively constituted by for example two loop antennas positioned in vertical planes crossing substantially rectangularly with each other and thus have directions of maximum sensitivity substantially rectangular to each other in a horizontal plane. Radio waves having such waveforms as shown in FIGS. 3A and 3B and received by the antennas 1 and 2 are selectively fed through a switching circuit 4 to a demodulating circuit. The demodulating circuit comprises a front end circuit 3, an intermediate frequency amplifier 5 and an FM detecting circuit 6. The radio wave having such a waveform as shown in FIG. 3C and fed to the front end circuit 3 is converted into an intermediate frequency signal by the front end circuit 3 and then fed to the intermediate frequency amplifier 5. The output of the amplifier 5 is fed to the FM detecting circuit 6 in which the received frequency modulated carrier is demodulated into a signal having such a waveform as shown in FIG. 3D and substantially corresponding to the original modulating signal and then transmitted to an input of a pulse noise suppressing circuit 7. The pulse noise suppressing circuit 7 is known per se and comprises a delay circuit 71 connected to the FM detecting circuit 6, a high-pass filter 72 connected also to the FM detecting circuit 6 for detecting noise components in the output of the circuit 6 having frequencies higher than a predetermined cutoff frequency, a trigger circuit 73 connected to the filter 72 and responsive to the noise components in the demodulated signal wave to generate a trigger signal, a gate circuit 74 connected to the delay circuit 71 for blocking the transmission of signal from the FM detecting circuit 6 to a multiplex decording circuit 8 in response to the trigger signal from the trigger circuit 73, and a level holding circuit 75 for maintaining, when blocking, the output of the pulse noise suppressor 7 in the last level of demodulated signal produced just prior to the gate-blocking. The pulse noise suppressing circuit 7 detects pulse noises having frequencies higher that the predetermined cutoff frequency of the filter 72 and cancells them by closing the gate 74. Accordingly, the multiplex decording circuit 8 receives a signal having such a waveform as shown in FIG. 3E and not including pulse noise components and separates the received signal, which comprises multiplexed audio signals, into the original left and right channel audio signals, which are output from terminals 8L and 8R, respectively.

Figure 3F:
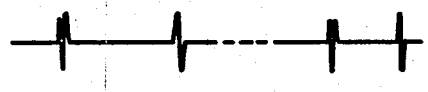
FIGS. 3F and 3G are diagrams showing waveforms occurrings at an input and an output of a detecting and wave-shaping circuit, respectively.
Figure 3G:
Figure 3H:
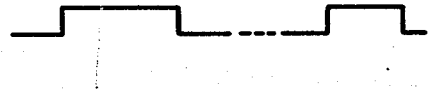
FIG. 3H is a diagram showing a waveform occurring at an output of a multipath noise detecting circuit.

The FM receiver has a multipath noise detecting circuit 10 which comprises a high-pass filter 101 connected to the output of the pulse noise suppressing circuit 7. The cutoff frequency of the filter 101 is predetermined to a value substantially equal to 100 KHz lower than the cutoff frequency of the filter 72 of the noise suppressor 7 in order to detect only multipath noise components. The multipath noise detecting circuit 10 further comprises an amplifier 102 connected to the filter. 101, a detecting and wave-shaping circuit 103 connected to the amplifier 102 for detecting and waveshaping the multipath noise components having such waveforms as shown in FIG. 3F from the filter 101 into a rectangular pulse having such a waveform as shown in FIG. 3G, a schmitt trigger circuit 104 responsive to the output of the detecting and wave-shaping circuit 103 for driving a bistable multivibrator 105. The bistable multivibrator 105 changes its state so as to produce alternately one of two predeterminen d.c. voltages or control signals having such waveforms as shown in FIG. 3H in response to the output pulses of the trigger circuit 104 each corresponding to a multipath noise. The switching circuit 4 connects alternately one of the antennas 1 and 2 to the input of the front end circuit 3 in response to the control signals.

As will be understood from the above description, a radio wave being received by one of the two antennas 1 and 2 is demodulated by the circuits 3, 5 and 6 into an original modulating signal which is then filtered by the pulse noise suppressing means 7 so that high frequency noise components originated from e.g. sparks of ignition plugs of motorcars are eliminated from the demodulated signal. In the FM receiver as shown in FIG. 1 the noise components due to multipath transmission phenomenon, having frequencies higher then 100 KHz, are detected by the multipath noise detecting circuit 10 and this circuit 10 controls the switching circuit 4 to switch immediately one of the antennas 1 and 2 being in a worse sensing condition to the other antenna being in a better sensing condition, every when a multipath noise is detected by the circuit 10.

Figure 2:
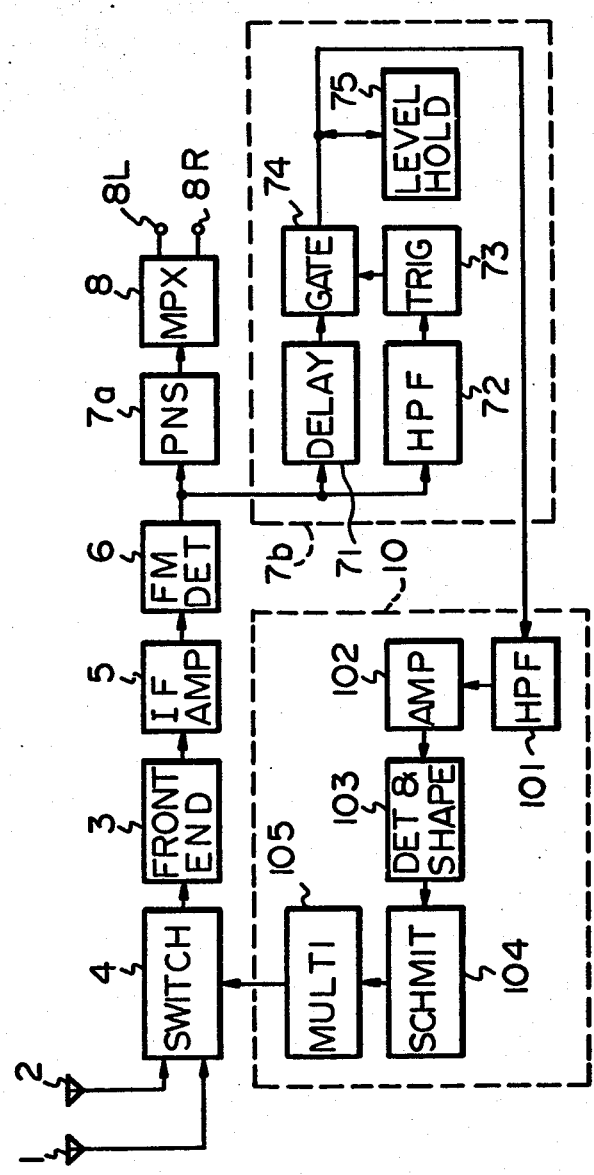
FIG. 2 is a schematic block diagram showing another embodiment of the present invention.

In the embodiment shown in FIG. 1, the means for suppressing pulse noises comprises substantially a single pulse noise suppressing circuit connected at one end to the FM detector 6 and at the other end to the multiplex decoder 8, whereas the second embodiment as shown in FIG. 2 has a pulse noise suppressing means comprising substantially basic and additional noise suppressing circuits 7a and 7b each of which is constructed similarly to that of the first embodiment shown in FIG. 1. The second embodiment shown in FIG. 2 is substantially the same as the first one of FIG. 1 except the construction of the pulse noise suppressing means and therefore no description will be given with respect to the other parts.

The basic pulse noise suppressing circuit 7a is provided between the output of the FM detector 6 and the input of the multiplex decording circuit 8, while the second additional pulse noise suppressing circuit 7b is provided between the output of the FM detector 6 and the input of the multipath noise detecting circuit 10. Accordingly, in this embodiment an advantage is accomplished that the cutoff frequency of filtering for the input signal of multipath noise detecting circuit 10 can be set independently of that for the input signal of the multiplex decording circuit 8.

It should be noted that the multipath detecting circuit 10 according to the present invention will not be affected by high frequency pulse noises such as ignition noises, since such deleterious noises are almost completely cancelled by the pulse noise suppressing means even when such noises happen to be received by the antennas. As a consequence of this fact, the multipath noise detecting circuit 10 can be set high in sensitivity of detection, with the result that the period during which multipath noises appear at the outputs 8L and 8R of the multiplex decoder 8 can be made shorter.

In an FM receiver according to the present invention one of the receiving antennas, which is in a sensing condition instantaneously better than that of the other antenna with respect to multipath transmission phenomenon, is always sensed by the demodulating circuit and therefore an FM receiver according to the present invention is especially suitable for use in a moving vehicle such as a motorcar.

It will be understood that the present invention is not to be limited to the exact constitution shown and described and that various changes and modifications may be made without departing from the spirit and scope of the present invention, as defined in the appended claims.

What is claimed is:
1. An FM receiver comprising:
at least two receiving directional antennas which have directions of maximum sensitivity different from each other;
demodulating circuit adapted to demodulate a frequency-modulated signal wave into a low frequency signal substantially corresponding to the original modulating signal;
pulse noise suppressing means connected to said demodulating circuit for suppressing high frequency noise components in said low frequency signal;
multipath noise detecting circuit connected to said pulse noise suppressing means for monitoring the output signal of said pulse noise suppressing means and generating alternately one of at least two predetermined control signals when multipath noise components with frequencies lower than said high frequency noise components appear in the output of said pulse suppressing means;

switching means connected to said multipath noise detecting circuit for selectively connecting, in response to said control signals, one of said antennas to the input of said demodulating circuit; and a multiplex decoding circuit connected to said pulse noise suppressing means for decoding the low frequency signal into the multiplexed original signals.

2. An FM receiver as claimed in claim 1, in which said pulse noise suppressing means includes a basic pulse noise suppressing circuit adapted to prohibit the low frequency signal to pass therethrough when a high frequency component with a frequency higher than a first predetermined frequency appears in the low frequency signal, and in which said multipath noise detecting circuit and said multiplex decoding circuit are connected to an output terminal of said pulse noise suppressing circuit.

3. An FM receiver as claimed in claim 2, in which said pulse noise suppressing circuit includes a delay circuit for applying a predetermined delay to the low frequency signal, a high-pass filter having a first predetermined cut off frequency for passing therethrough said high frequency component contained in said low frequency signal, a trigger circuit for producing a gate pulse signal in response to said high frequency component passed through said high-pass filter, and a gate circuit for prohibiting the delayed low frequency signal from said delay circuit to pass therethrough when triggered by said gate pulse signal from said trigger circuit.

4. An FM receiver as claimed in claim 2, in which said pulse noise suppressing means further includes an additional pulse noise suppressing circuit adapted to prohibit the low frequency signal to pass therethrough when a high frequency component appears with a frequency higher than a second predetermined frequency lower than said first predetermined frequency appears in the low frequency signal and in which said multiplex decoding circuit is connected to said basic pulse noise suppressing circuit and said multipath noise detecting circuit is connected to said additional pulse noise suppressing circuit.

5. An FM receiver as claimed in claim 4, in which each of said basic and additional pulse noise suppressing circuits includes a delay circuit for applying a predetermined delay to the low frequency signal, a high-pass filter having a first predetermined cut off frequency for passing therethrough said high frequency component contained in said low frequency signal, a trigger circuit for producing a gate pulse signal in response to said high frequency component passed through said high-pass filter, and a gate circuit for prohibiting the delayed low frequency signal from said delay circuit to pass therethrough when triggered by said gate pulse signal from said trigger circuit.

6. An FM receiver as claimed in any one of claims 1, 2, 3, 4 and 5, in which said receiving directional antennas are provided two in number and said multipath noise detecting circuit comprises a high-pass filter connected to said pulse noise suppressing means and having a predetermined cutoff frequency lower than the frequencies of said high frequency noise components contained in said low frequency signal, a detecting and wave-shaping circuit contected to said high-pass filter for detecting and wave-shaping the multipath noise from said high-pass filter into a rectangular pulse, and a bistable multiviblator connected to said detecting and wave-shaping circuit for selectively generating said control signals.

* * * * *